United States Patent
Ebel et al.

(10) Patent No.: US 6,235,640 B1
(45) Date of Patent: May 22, 2001

(54) TECHNIQUES FOR FORMING CONTACT HOLES THROUGH TO A SILICON LAYER OF A SUBSTRATE

(75) Inventors: Timothy M. Ebel, San Jose, CA (US); Mathias Fecher, Oberpframmern (DE)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/144,652

(22) Filed: Sep. 1, 1998

(51) Int. Cl.$^7$ ................................................. H01L 21/3065
(52) U.S. Cl. .................... 438/706; 438/708; 438/709; 438/710; 438/719; 438/723; 438/743
(58) Field of Search ..................................... 438/729, 723, 438/637, 8, 719, 706, 743.1, 709, 708, 734, 700, 710

(56) References Cited

U.S. PATENT DOCUMENTS

| | | | |
|---|---|---|---|
| 4,902,897 | * 2/1990 | Iwamatsu | 250/423 R |
| 5,372,673 | * 12/1994 | Stager et al. | 438/8 |
| 5,503,901 | * 4/1996 | Sakai et al. | 438/723 |
| 5,595,627 | * 1/1997 | Inazawa et al. | 156/643.1 |
| 5,670,426 | * 9/1997 | Kuo et al. | 438/637 |
| 5,681,780 | 10/1997 | Mihara et al. | 437/228 |
| 5,683,548 | * 11/1997 | Hartig et al. | 438/729 |
| 5,843,847 | * 4/2000 | Pu et al. | 438/723 |
| 6,033,990 | * 3/2000 | Kishimoto et al. | 438/710 |
| 6,046,114 | * 4/2000 | Tohda | 438/695 |

OTHER PUBLICATIONS

Patent Application No. 08/994,552 Filed Dec. 19, 1997 Entitled "Method and Composition for Drying Etching in Semiconductor Fabrication," 19 pages.

Patent Application No. 08/892,610 Filed Jul. 14, 1997 Entitled "Compact Microwave Downstream Plasma System," 209 pages.

Notification of Transmittal of International Search Report and International Search Report, dated Dec. 22, 1999.

Westerheim, A.C. et al., "High–Density, ICP Etch of Sub Half–Micron Critical Layers", Journal of Vacuum Science and Technology: Part B, American Institute of Physics, vol. 16, No. 3, pp. 2699–2706.

Chen, F.F., "Experiments on Helicon Plasma Sources", Journal of Vacuum Science and Technology A, Jul.–Aug. 1992, USA, vol. 10, No. 4, pp. 1389–1401.

* cited by examiner

Primary Examiner—Robert Kunemund
Assistant Examiner—Binh X. Tran
(74) Attorney, Agent, or Firm—Beyer Weaver & Thomas LLP

(57) ABSTRACT

A method for simultaneously stripping a photoresist mask employed for etching, in a low pressure, high density plasma processing chamber, a contact hole through an oxide layer to a silicon layer of a substrate and soft etching a surface of the silicon layer at a bottom of the contact hole. The technique of simultaneously stripping and soft etching is configured to substantially remove the photoresist mask and reducing a contact resistance at the bottom of the contact hole simultaneously. The method includes flowing an etchant source gas comprising a fluorocarbon and $O_2$ into the plasma processing chamber after the contact hole is formed but prior to filling the contact hole with a substantially conductive material. There is also included forming a plasma from the etchant source gas. Additionally, there is included employing the plasma for simultaneously stripping and soft etching for a predefined duration sufficient to lower a contact resistance between the silicon substrate and the substantially conductive material that is subsequently deposited into the contact hole to a predefined acceptable level.

24 Claims, 4 Drawing Sheets

TECHNIQUES FOR FORMING CONTACT HOLES THROUGH TO A SILICON LAYER OF A SUBSTRATE

BACKGROUND OF THE INVENTION

The present invention relates to the fabrication of semiconductor devices. More particularly, the present invention relates to improved techniques for forming contact holes through to a silicon layer of a substrate in a plasma processing chamber.

In the fabrication of semiconductor devices (e.g., integrated circuits or flat panel displays), contact holes, such as trenches, vias, and the like, may sometimes be formed through an oxide layer to a silicon layer of a substrate (e.g., a silicon wafer or a glass panel). It is known that such contact holes may be etched in a plasma processing chamber wherein a plasma that is capable of etching the oxide material through openings in a photoresist mask is utilized.

To facilitate discussion, FIG. 1 depicts a simplified layer stack 100, including a silicon layer 102, oxide (i.e., $SiO_2$ or a material that contains $SiO_2$) layer 104 and photoresist mask 106. To simplify discussion, only some exemplary layers are shown. As is well known, however, other layers (including, for example, adhesion layer, seed layer, anti-reflective coating layer, or another layer) may also be disposed above, below, or in between the shown layers. Silicon layer 102 represents, in this example, a monocrystal silicon layer that may be disposed above a substrate or may even represent the monocrystal silicon substrate itself. In photoresist mask 106, an exemplary opening 108 is shown through which the etching plasma may enter to remove material from oxide layer 104 to form the desired contact hole.

In FIG. 2, a contact hole 202 is shown formed through oxide layer 104 down to the interface between oxide layer 104 and silicon layer 102. Typically, contact hole 202 is etched out of a plasma that is formed using a fluorocarbon-based etchant source gas. By way of example, suitable etchant source gases employed to etch the contact hole through oxide layer 104 may include $CHF_3$ or $CHF_3/C_4F_8$. When energized, the fluorocarbon etchant source gas forms carbon species and fluorine species to etch the areas of oxide layer 104 that are not protected by photoresist mask 106. By timing the etch or providing an endpoint, the etch may be stopped at about the interface between oxide layer 104 and silicon layer 102.

It has been found, however, that the etching of contact hole 202 leaves a damaged region at the bottom of contact hole 202. By way of example, the bottom of contact hole 202 may have a layer of amorphous silicon having adsorbed C, H, or F. In FIG. 2, this damaged region is shown as damaged region 204 at the bottom of contact hole 202.

The presence of damaged region 204 unfortunately increases the contact resistance between the conductive material that is subsequently deposited into contact hole 202 and the contact region within silicon layer 102 (e.g., a doped well). The increased contact resistance reduces the electrical performance of the device formed on the substrate by, for example, reducing its operating speed or increasing its power consumption. If damaged region 204 is sufficiently thick, the contact resistance may be great enough to render the resultant device defective.

In the prior art, the contact resistance due to damaged region 204 may be reduced by removing some of damaged region 204 in a separate etch process known as a soft etch. The soft etch process, which is typically a separate etch step from the main contact etch that is employed to etch through oxide layer 104, is typically performed using a gas mixture containing fluorocarbons.

Following the soft etch, another separate stripping step is employed to strip photoresist mask 106, as well as adsorbed etch byproducts that are formed on interior surfaces of the plasma processing chamber during the main contact etch. The stripping step typically employs $O_2$ as the main etchant source gas. Alternatively, some prior art processes perform a separate stripping operation prior to performing the soft etch. In high density plasma processing chambers (i.e., those producing plasma with ion density greater than about $10^{13}$ ions/cm$^3$), the stripping and main contact etch operations are typically performed in the same plasma processing chamber to allow the chamber to be cleaned of the main contact etch byproducts while the photoresist mask is stripped.

The requirement of three separate processing steps to etch a contact hole through the oxide layer (i.e., a first main contact etch, a soft etch, and a stripping operation) has been found to be disadvantageous as these three separate processes tend to be time consuming. With the prior art technique, the throughput of substrates through the plasma processing chamber is relatively low, which disadvantageously increases the cost ownership of the etch tool. If these three separate processing steps are performed in different processing systems, additional costly equipments may be required, further driving up the cost of producing the semiconductor-based products.

In view of the foregoing, there are desired improved techniques for forming contact holes through to a silicon layer of a substrate in a plasma processing chamber.

SUMMARY OF THE INVENTION

The invention relates, in one embodiment, to a method for etching a contact hole through an oxide layer to a silicon layer of a substrate. The method includes providing the substrate, including the silicon layer and positioning the substrate within the plasma processing chamber. The method also includes performing a contact etch, which includes etching the contact hole through the oxide layer to the silicon layer. The contact etch employs a first plasma comprising carbon species and fluorine species. Thereafter, the method includes simultaneously stripping a photoresist mask that is provided above the oxide layer for the contact etch and soft etching a surface of the silicon layer at a bottom of the contact hole. This simultaneous stripping and soft etching is performed by flowing an etchant source gas comprising a fluorocarbon and $O_2$ into the plasma processing chamber, forming a second plasma from the etchant source gas, and employing the second plasma from the etchant source gas for the simultaneous stripping and soft etching.

The invention relates, in another embodiment, to a method for simultaneously stripping a photoresist mask employed for etching, in a low pressure, high density plasma processing chamber, a contact hole through an oxide layer to a silicon layer of a substrate and soft etching a surface of the silicon layer at a bottom of the contact hole. The technique of simultaneously stripping and soft etching is configured to substantially remove the photoresist mask and reduce the contact resistance at the bottom of the contact hole simultaneously. The method includes flowing an etchant source gas comprising a fluorocarbon and $O_2$ into the plasma processing chamber after the contact hole is formed but prior to filling the contact hole with a substantially conductive material. There is also included forming a plasma from the etchant source gas. Additionally, there is included employing the plasma for simultaneously stripping and soft etching for a predefined duration sufficient to lower a contact resistance between the silicon substrate and the substantially conductive material that is subsequently deposited into the contact hole to a predefined acceptable level.

These and other advantages of the present invention will become apparent upon reading the following detailed descriptions and studying the various figures of the drawings.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
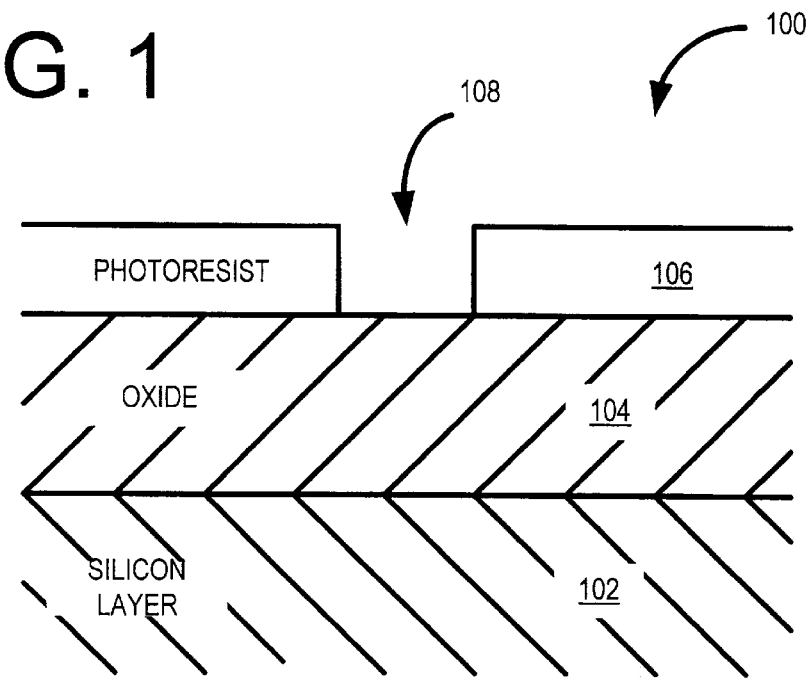
FIG. 1 depicts, to facilitate discussion, a simplified layer stack, including a silicon layer, an oxide-containing layer 104 and a photoresist mask.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with one embodiment of the present invention, there is provided an improved technique for simplifying the process of etching a contact hole through to the surface of a silicon layer of a semiconductor substrate. The improved contact hole formation technique preferably simultaneously performs the soft etch on the damaged region at the bottom of the contact hole while stripping the photoresist/adsorbed etch byproducts. Thus, the stripping of the photoresist/adsorbed etch byproducts and the soft etch, which are two separate process steps in the prior art, are combined into a single processing step to be performed in the same low pressure, high density plasma processing chamber that is employed for the main contact etch. Consequently, the contact resistance at the bottom of the contact hole is reduced at the same time that the plasma processing chamber is cleaned, thereby reducing the number of required steps from three to two.

In a nonobvious manner, the combined stripping and soft etch is simultaneously performed using a plasma formed from an etchant source gas that includes a mixture of fluorocarbon and $O_2$. In the typical case, the flow rate of the fluorocarbon gas employed during the combined stripping and soft etch operation is lower than the flow rate of the fluorocarbon gas employed during the main contact etch operation. The use of an etchant source gas that includes fluorocarbon and $O_2$ while stripping the photoresist/adsorbed etch byproducts is nonobvious since stripping is designed to remove carbon and fluorine-based byproducts that were left behind as a result of the main contact etch. In using an etchant source gas that includes a mixture of fluorocarbon and $O_2$ for the stripping operation, it is proposed herein, in a counterintuitive manner, that stripping employs the very species (i.e., fluorine and carbon) that the stripping process is designed to remove. However, sufficient $O_2$ gas is provided to ensure that stripping of photoresist/adsorbed etch byproducts occurs during this step.

Furthermore, the use of a fluorocarbon gas during the stripping operation is nonobvious since the stripping operation has always been designed with the goal of maximizing the removal of photoresist/adsorbed etch byproducts while minimizing any incidental removal of materials from other layers of the layer stack. Using a gas such as a fluorocarbon-based etchant source gas that is known for attacking the oxide and underlying monocrystal silicon is counterintuitive to designers of stripping processes. Nevertheless, as will be shown hereinbelow, the use of an etchant source gas that comprises a fluorocarbon gas and $O_2$ to simultaneously perform the soft etch and stripping of the photoresist/adsorbed etch byproducts advantageously eliminates the requirement that these two operations be performed in two separate processing steps (as was required in the prior art).

It is contemplated that the improved contact hole formation technique of the present invention may be practiced in any suitable plasma processing system, including those adapted for dry etching, plasma etching, reactive ion etching (RIE), magnetically enhanced reactive ion etching (MERIE), or the like. This is true irrespective whether energy to the plasma is delivered through capacitively coupled parallel electrode plates, through electron cyclotron resonance (ECR) sources, microwave plasma sources, through inductively coupled RF sources such as helicon, helical resonators, and induction coils (whether or not planar). ECR and TCP-brand (transformer coupled plasma) plasma processing systems, among others, are available from Lam Research Corporation of Fremont, Calif.

Figure 3:
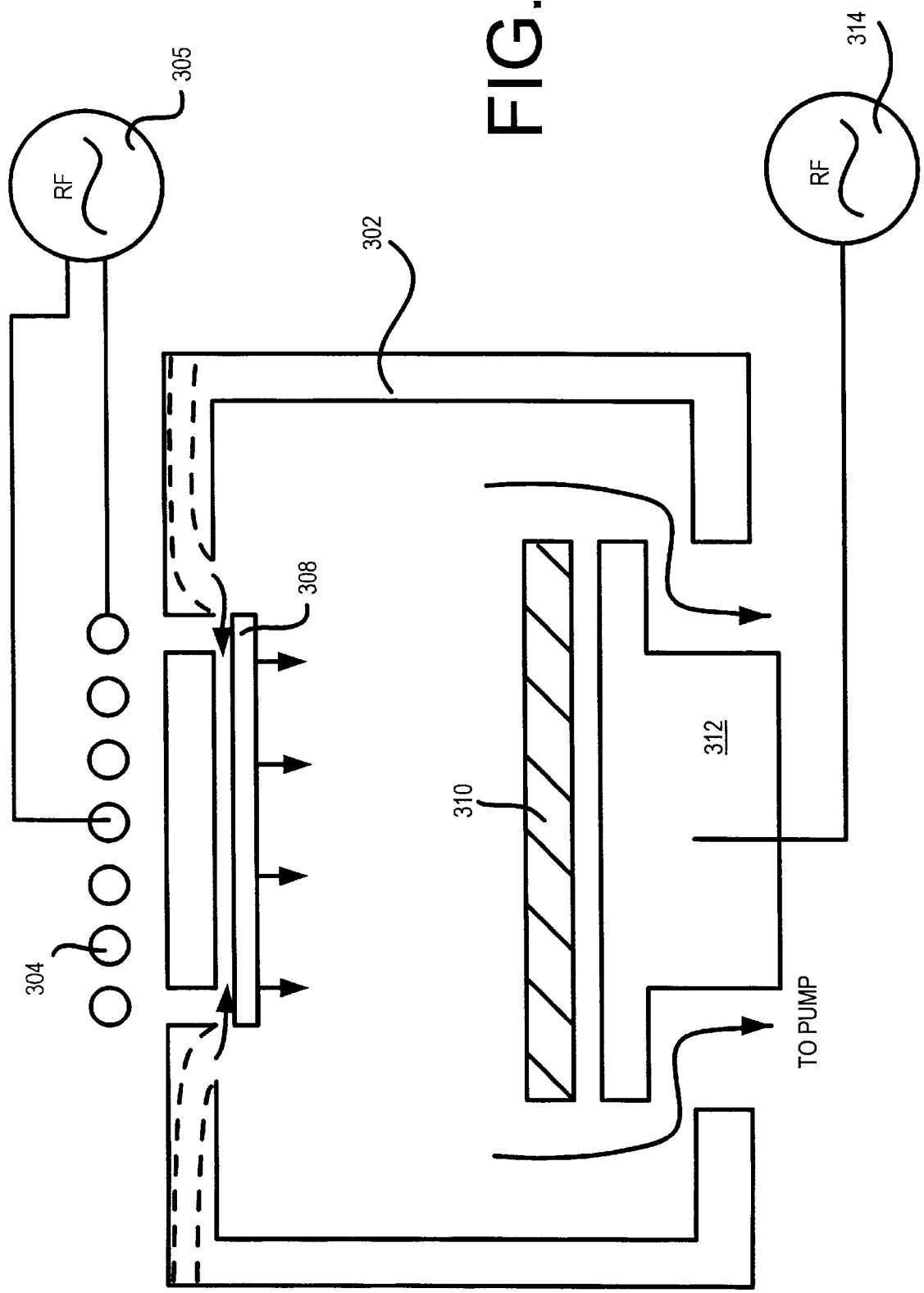
FIG. 3 illustrates a simplified schematic of the TCP™ 9100 plasma reactor, representing a plasma processing chamber suitable for use with the present invention.

In one embodiment, the present invention is practiced in a TCP™ 9100 low pressure, high density plasma reactor, which is available from Lam Research Corporation, although, as mentioned above, any other conventional and suitable plasma processing systems may well be employed. FIG. 3 illustrates a simplified schematic of the TCP™ 9100 plasma reactor, including a plasma processing chamber 302. Above chamber 302, there is disposed an electrode 304, which is implemented by an induction coil in the example of FIG. 3. Coil 304 is energized by a RF generator 305 via a matching network (not shown in FIG. 3). The RF power supplied to coil 304 may have an RF frequency of, for example, 13.56 MHz.

Within chamber 302, there is provided a gas distribution plate 308, which preferably includes a plurality of holes for distributing gaseous source materials, e.g., the etchant source gases, into the RF-induced plasma region between itself and a substrate 310. The gaseous source materials may also be released from ports built into the walls of the chamber itself. Substrate 310 is introduced into chamber 302 and disposed on a chuck 312, which acts as the bottom electrode and is preferably biased by a radio frequency generator 314 (also typically via a matching network). The RF energy supplied by RF generator 314 may have an RF frequency of, for example, 4 MHz although other RF frequencies may also be employed. Chuck 312 may represent any suitable work piece holder and may be implemented by, for example, an electrostatic (ESC) chuck, a mechanical-type chuck, a vacuum chuck, and the like. During plasma etching, the pressure within chamber 302 is preferably kept low, e.g., between about 1 and about 50 m Torr in one embodiment.

Figure 4:
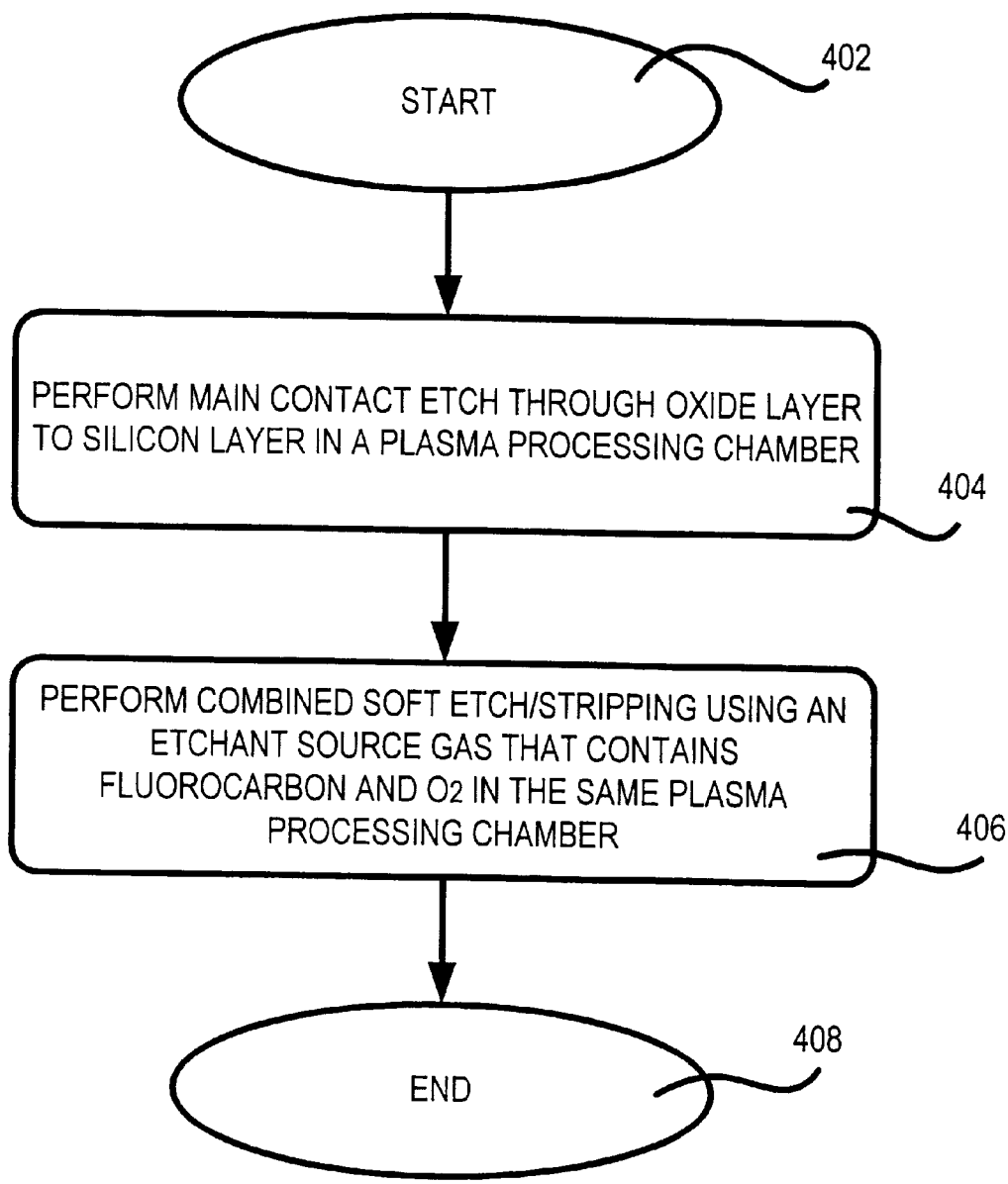
FIG. 4 illustrates, in accordance with one embodiment of the present invention, the process steps involved in forming a contact hole through an oxide layer to a silicon layer in a low pressure, high density plasma processing chamber.

FIG. 4 illustrates, in accordance with one embodiment of the present invention, the process steps involved in forming a contact hole through an oxide layer to a silicon layer in a low pressure, high density plasma processing chamber. In step 404, the main contact etch is performed through the oxide layer to the silicon layer. To etch through the oxide layer, a fluorocarbon-based etchant source gas may be employed. As mentioned, the silicon layer may represent a silicon layer disposed above the substrate or may represent the silicon wafer itself.

Figure 2:
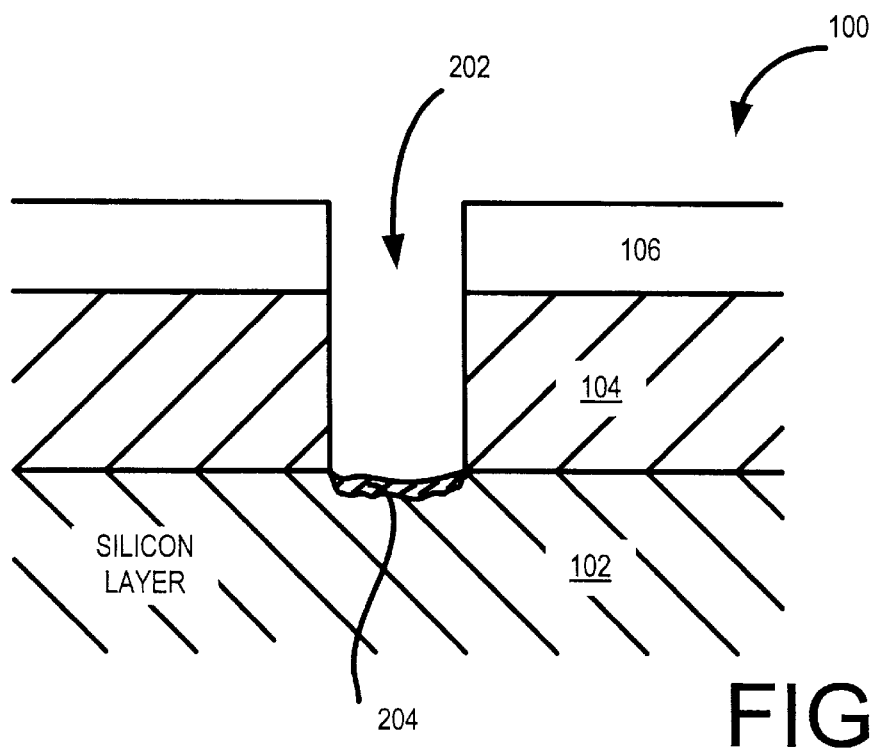
In FIG. 2, a contact hole is shown formed through the oxide layer of the layer stack of FIG. 1.

With reference to the example of FIG. 2, contact hole 202 is formed after step 404 is performed on the layer stack. To simultaneously minimize the contact resistance at the bottom of the contact hole and to strip the photoresist/adsorbed etch byproducts, there is shown in step 406 the simultaneous soft etch and stripping of the photoresist/adsorbed etch byproducts that were formed in step 404.

In step 406, the combined soft etch and stripping process is performed using a plasma formed from an etchant source gas that comprises fluorocarbon and $O_2$. The fluorocarbon is preferably $CF_4$, but may represent any suitable fluorocarbon (such as $C_2F_6$, $C_4F_8$, $CHF_3$, $C_2HF_5$, and the like) or combinations thereof. As mentioned, the use of a fluorocarbon gas (in combination with $O_2$) during the stripping process is nonobvious since such use adds to the chamber the very constituent elements that the stripping process is designed to remove. Further, the use of a fluorocarbon-based plasma is counterintuitive during the stripping process since the use of a fluorocarbonbased plasma is counter to the desire to minimize removal of materials other than photoresist and adsorbed etch byproducts during the stripping process.

Note that in step 406, the combined soft etch and stripping step is performed in the same low pressure, high density plasma processing chamber which the main contact etch step 404 is performed. In this manner, the photoresist mask may be removed, the contact resistance at the bottom of the contact hole may be reduced, and the adsorbed etch byproducts may be removed from inferior surfaces of the plasma processing chamber all simultaneously in one combined step.

There exists in the prior art a stripping process that involves three separate substeps. In this case, the invention is also applicable and converts the three-substep stripping process of the prior art into a simultaneous stripping and soft etching process (also comprising three substeps) to eliminate the requirement of a separate soft etch process step. In accordance with one aspect of the present invention, the simultaneous stripping and soft etching process may be accomplished by adding the fluorocarbon gas in any of the substeps of the three-substep stripping process or in a plurality of the substeps.

Figure 5:
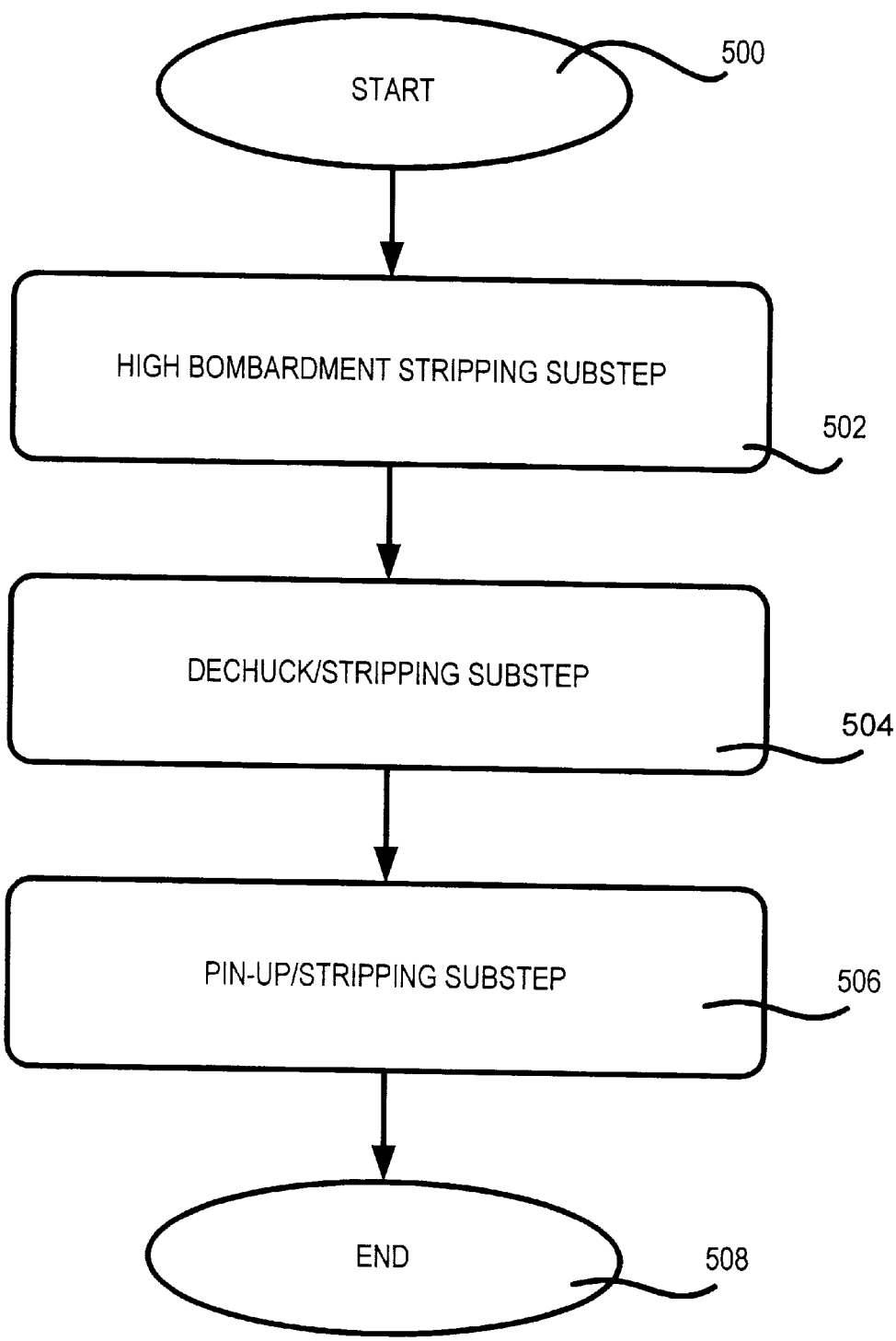
FIG. 5 depicts, in accordance with another aspect of the present invention, the application of the invention to a stripping process that includes three substeps.

FIG. 5 depicts this embodiment whereby the stripping of the photoresist/adsorbed etch byproducts is performed in three separate substeps 502, 504, and 506. Substep 502 is characterized by a relatively high bombardment step wherein the bottom power of the low pressure, high density plasma processing chamber is on to increase bombardment of the photoresist. In substep 504, the bottom power is turned off to dechuck the substrate from the chuck. Stripping however continues as plasma continues to be formed from the $O_2$ source gas. In substep 506, the substrate is raised on pins to physically separate the substrate from the chuck while stripping continues using the plasma within the plasma processing chamber.

In accordance with one aspect of the present invention, the addition of the fluorocarbon gas (such as $CF_4$) to accomplish the simultaneous soft etch may be added during any of substeps 502, 504, and 506. Preferably, the fluorocarbon gas (e.g., $CF_4$) is added during substep 506 wherein the substrate is raised on pins away from the chuck while stripping continues with the plasma. It is believed that the physical separation of the substrate from the chuck increases the effectiveness of the soft etch and/or the stripping process since the substrate is allowed to become hotter (in the absence of an intimate contact with the chuck) to increase the soft etch rate and/or the stripping rate.

EXAMPLES

In one example, a six-inch monocrystal silicon wafer having thereon a photoresist mask (about 1.2 microns thick) disposed above an oxide layer is etched. The contact hole is to be etched through the oxide layer down to the surface of the silicon substrate. The oxide layer itself is a multi-layer film composed of layers of doped and undoped oxides and having a thickness of about 1.5 to about 2.1 microns. The contact holes to be formed have contact openings of about 0.55 microns. Thereafter, a combined soft etch/stripping process is performed to simultaneously remove the photoresist, remove the adsorbed etch byproducts from interior surfaces of the low pressure, high density plasma processing chamber, and reduce the contact resistance at the bottom of the contact hole.

The approximate parameters described below are suitable for this exemplary etch in the aforementioned TCP™ 9100 plasma processing system. However, those skilled in the art can readily adapt the disclosed parameters to perform the disclosed invention in other high density plasma processing chambers. The adaptation of the disclosed parameters to the requirements of different high density plasma processing chambers is within the skills of those familiar with plasma etching processes.

For the main contact etch (e.g., step 404 of FIG. 4), the pressure within the plasma processing chamber may be between about 2 mT and about 50 mT, more preferably between about 3 mT and about 15 mT and preferably at about 5 mT. The top (TCP) power is between about 500 watts and about 3,000 watts, more preferably between about 800 watts and about 2,500 watts, and preferably at about 1,700 watts. The bottom power is between about 300 watts and about 1,250 watts, more preferably between about 600 watts and about 1,250 watts, and more preferably at about 1,100 watts. The flow rate of $C_2F_6$ is between about zero sccm (standard cubic centimeters per minute) and about 100 sccm, more preferably between about 5 sccm and about 50 sccm and preferably at about 10 sccm. The flow rate of $C_2HF_5$ is between about 0 sccm and about 100 sccm, more preferably between about 20 sccm and about 100 sccm, and preferably at about 60 sccm. Note that although $C_2F_6$ and $C_2HF_5$ are employed, the main contact etch may be performed using any suitable fluorocarbon single gas or mixture thereof. The main contact etch is allowed to continue for between about 30 seconds and about 300 seconds, more preferably between about 60 seconds and about 120 seconds, and preferably for about 90 seconds.

For the high bombardment substep of the stripping process (e.g., substep 5O₂ of FIG. 5) the pressure may be between about 5 mT and about 400 mT, more preferably between about 10 mT and about 20 mT and preferably at about 15 mT. The top (TCP) power is between about 300 watts and about 3,000 watts, more preferably between about 400 watts and about 2,000 watts, and preferably at about 1,000 watts. The bottom power is between about 0 watts to a value less than the power setting of the top (TCP) power setting, more preferably between about 100 watts and about 300 watts, and preferably at about 200 watts. The flow rate of the O₂ source gas is between about 100 sccm and about 1,000 sccm, more preferably between about 200 sccm and about 700 sccm, and preferably at about 500 sccm. This high bombardment substep is allowed to continue for between about 5 seconds and about 60 seconds, more preferably between about 6 seconds and about 20 seconds, and preferably for about 15 seconds.

For the dechuck and stripping substep of the stripping process (e.g., substep 504 of FIG. 5), the pressure may be between about 5 mT and about 400 mT, more preferably between about 20 mT and about 100 mT, and preferably at about 18 mT. The top (TCP) power may be between about 300 watts and 3,000 watts, more preferably between about 400 watts and about 2,000 watts, and preferably at about 1,000 watts. The bottom power is preferably set at substantially zero for this substep. The O₂ flow rate may be between about 100 sccm and about 1,000 sccm, more preferably between about 200 sccm and about 700 sccm, and preferably at about 250 sccm. The dechuck and stripping substep is allowed to continue for between about 15 seconds and about 90 seconds, more preferably between about 15 seconds and about 30 seconds, and preferably for about 20 seconds.

In the last substep of this example, CF₄ is added to simultaneously perform the soft etch and stripping of the photoresist/adsorbed etched byproducts. Although this is preferred, it should be noted that the fluorocarbon gas may be added to any other substep of the stripping process or a plurality of the substeps. In this last substep in which the fluorocarbon gas is added, the pressure may be between about 5 mT and about 400 mT, more preferably between about 10 mT and about 20 mT, and preferably at about 18 mT. The top (TCP) power may be between about 300 watts and about 3,000 watts, more preferably between about 400 watts and about 2,000 watts, and preferably at about 1,000 watts. The bottom power is preferably set at about zero. The O₂ flow rate is preferably between about 100 sccm and about 1,000 sccm, more preferably between about 200 sccm and about 700 sccm, and preferably at about 225 sccm. The CF₄ flow rate is about between about 5 sccm and about 200 sccm, more preferably between about 5 sccm and about 50 sccm, and preferably at about 25 sccm. This substep is allowed to continue for between about 15 seconds and about 300 seconds, more preferably between about 30 seconds and about 120 seconds, and preferably for about 60 seconds.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for etching a contact hole through an oxide layer to a silicon layer of a substrate, said method being performed in a low pressure, high density plasma processing chamber, comprising:

providing said substrate, including said silicon layer;

positioning said substrate within said plasma processing chamber;

performing a contact etch, said performing including etching said contact hole through said oxide layer to said silicon layer, said contact etch employing a first plasma comprising carbon species and fluorine species; and thereafter simultaneously stripping a photoresist mask that is provided above said oxide layer for said contact etch and soft etching a surface of said silicon layer at a bottom of said contact hole by flowing an etchant source gas comprising a fluorocarbon and O₂ into said plasma processing chamber, forming a second plasma from said etchant source gas, and employing said second plasma from said etchant source gas for said simultaneous stripping and soft etching.

2. The method of claim 1 wherein said fluorocarbon represents CF₄.

3. The method of claim 1 wherein said plasma processing chamber represents an inductively coupled plasma processing chamber.

4. The method of claim 1 wherein said substrate represents a glass panel substrate configured to form a flat panel display.

5. The method of claim 1 wherein said simultaneously stripping and soft etching is performed for a duration sufficient to lower a contact resistance between a subsequently deposited contact material and said silicon layer.

6. The method of claim 1 wherein said simultaneously stripping and soft etching is performed while a bias power level of said plasma processing chamber is substantially zero.

7. The method of claim 1 wherein said simultaneously stripping and soft etching is performed while said layer is dechucked from a chuck supporting said layer during said contact etch.

8. The method of claim 1 wherein said step of simultaneously stripping and soft etching further comprises the step of dechuckinz the substrate during the step of employing said second plasma.

9. The method of claim 8 wherein said step of simultaneously stripping and soft etching further comprises the step of raising the substrate above a chuck after said step of dechucking the substrate and during the step of employing said second plasma.

10. A method for simultaneously stripping a photoresist mask employed for etching, in a low pressure, high density plasma processing chamber, a contact hole through an oxide layer to a silicon layer of a substrate and soft etching a surface of said silicon layer at a bottom of said contact hole, said simultaneously stripping and soft etching being configured to substantially remove said photoresist mask and reducing a contact resistance at said bottom of said contact hole simultaneously, said method comprising:

flowing an etchant source gas comprising a fluorocarbon and O₂ into said plasma processing chamber after said contact hole is formed but prior to filling said contact hole with a substantially conductive material;

forming a plasma from said etchant source gas; and employing said plasma for said simultaneously stripping and soft etching, said simultaneously stripping and soft etching is performed for a duration sufficient to lower a contact resistance between said silicon substrate and said substantially conductive material that is subsequently deposited into said contact hole.

11. The method of claim 10 wherein said etching said contact hole prior to said simultaneously stripping and soft etching is performed with a plasma that includes carbon species and fluorine species.

12. The method of claim 10 wherein said fluorocarbon represents $CF_4$.

13. The method of claim 10 wherein said plasma processing chamber represents an inductively coupled plasma processing chamber.

14. The method of claim 10 wherein said simultaneously stripping and soft etching is performed after said etching said contact hole of every substrate.

15. The method of claim 10 wherein said simultaneously stripping and soft etching is performed while a bias power level of said plasma processing chamber is substantially zero.

16. The method of claim 10 wherein said simultaneously stripping and soft etching is performed while said substrate is dechucked from a chuck supporting said substrate during said contact etch.

17. The method of claim 10 wherein said of simultaneously stripping and soft etching further comprises the step of dechucking the substrate during the step of employing said second plasma.

18. The method of claim 17 wherein said step of simultaneously stripping and soft etching further comprises the step of raising the substrate after said step of dechucking the substrate and during the step of employing said second plasma.

19. A method for etching a contact hole through an oxide layer to a monocrystal silicon layer of a substrate, said method being performed in a plasma processing chamber configured to produce plasma having an ion density higher than about $10^{13}$ ions/cm$^3$, comprising:

providing said substrate, including said monocrystal silicon layer;

positioning said substrate within said plasma processing chamber;

performing a contact etch, said performing including etching said contact hole through said oxide layer to said monocrystal silicon layer, said contact etch employing a first plasma comprising carbon species and fluorine species; and thereafter simultaneously stripping adsorbed byproducts of said contact etch within said plasma processing chamber and soft etching a surface of said monocrystal silicon layer at a bottom of said contact hole by flowing an etchant source gas comprising a fluorocarbon and $O_2$ into said plasma processing chamber, forming a second plasma from said etchant source gas, and employing said second plasma from said etchant source gas for said simultaneously stripping and soft etching, whereby said simultaneously stripping and soft etching is performed in the same chamber employed for said performing said contact etch and whereby said simultaneously stripping and soft etching is performed prior to a filling of said contact hole with a substantially conductive material.

20. The method of claim 19 wherein said step of simultaneously stripping and soft etching further comprises the step of dechucking the substrate during the step of employing said second plasma.

21. The method of claim 19 wherein said step of simultaneously stripping and soft etching further comprises the step of raising the substrate above a chuck after said step of dechucking the substrate and during the step of employing said second plasma.

22. The method of claim 19 wherein said simultaneously stripping and soft etching is performed for a duration sufficient to lower a contact resistance between a subsequently deposited contact material and said monocrystal silicon layer.

23. The method of claim 19 wherein said simultaneously stripping and soft etching is performed while a bias power level of said plasma processing chamber is substantially zero.

24. The method of claim 19 wherein said simultaneously stripping and soft etching is performed while said layer is dechucked from a chuck supporting said layer during said contact etch.

* * * * *